(12) United States Patent
Merritt

(10) Patent No.: US 6,578,165 B2
(45) Date of Patent: Jun. 10, 2003

(54) INTERNAL GUARDBAND FOR SEMICONDUCTOR TESTING

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/945,511

(22) Filed: Aug. 30, 2001

(65) Prior Publication Data

US 2002/0026610 A1 Feb. 28, 2002

Related U.S. Application Data

(63) Continuation of application No. 09/031,159, filed on Feb. 26, 1998, now Pat. No. 6,418,547.

(51) Int. Cl.⁷ .............................................. G01R 31/28
(52) U.S. Cl. ..................................... 714/724; 365/201
(58) Field of Search ............................... 714/718, 724; 365/201

(56) References Cited

U.S. PATENT DOCUMENTS

| | | | |
|---|---|---|---|
| 5,245,577 A | 9/1993 | Duesman et al. ............ 365/201 |
| 5,293,341 A | * 3/1994 | Tsujimoto .................... 365/201 |
| 5,331,593 A | 7/1994 | Merritt et al. ......... 365/189.11 |
| 5,349,566 A | 9/1994 | Merritt et al. ............ 365/233.5 |
| 5,361,230 A | 11/1994 | Ikeda et al. .................. 365/194 |
| 5,444,408 A | 8/1995 | Merritt |
| 5,455,801 A | 10/1995 | Blodgett et al. ............. 365/222 |
| 5,457,659 A | 10/1995 | Schaefer ...................... 365/222 |
| 5,525,926 A | 6/1996 | Merritt ........................ 327/535 |
| 5,528,173 A | 6/1996 | Merritt et al. ................. 326/80 |
| 5,544,108 A | 8/1996 | Thomann ..................... 365/201 |
| 5,598,376 A | 1/1997 | Merritt et al. .......... 365/230.06 |
| 5,606,567 A | 2/1997 | Agrawal et al. .............. 714/732 |
| 5,623,501 A | 4/1997 | Cooke et al. ................. 714/725 |
| 5,640,364 A | 6/1997 | Merritt et al. ............. 365/233.5 |
| 5,644,538 A | 7/1997 | Merritt ........................ 365/194 |
| 5,754,486 A | * 5/1998 | Nevill et al. ................. 365/201 |
| 5,787,092 A | 7/1998 | Jaynes et al. ................. 714/724 |
| 5,826,006 A | 10/1998 | Saitoh .......................... 714/42 |
| 5,831,918 A | 11/1998 | Merritt et al. ............... 365/201 |
| 5,886,901 A | 3/1999 | Magoshi ......................... 716/6 |
| 5,894,548 A | 4/1999 | Horie ............................ 714/30 |
| 5,898,702 A | 4/1999 | Narayanan et al. .......... 714/726 |
| 5,903,512 A | 5/1999 | Wong et al. ................. 365/233 |
| 5,923,676 A | 7/1999 | Sunter et al. ................ 714/733 |
| 5,991,214 A | 11/1999 | Merritt et al. ............... 365/201 |

OTHER PUBLICATIONS

Gauthron, C., "Testing ASICs at–speed", *IEEE*, 328–332, (1991).
IBM, "Self–timed performance test for stand–alone random access memories", *IBM Technical Disclosure Bulletin*, vol. 30, Issue 5, 161–162, (Oct. 1987).

* cited by examiner

*Primary Examiner*—Albert Decady
*Assistant Examiner*—Shelly A Chase
(74) *Attorney, Agent, or Firm*—Schwegman, Lundberg, Woessner & Kluth, P.A.

(57) ABSTRACT

An internal guardband for use in semiconductor testing is disclosed. One aspect of the invention is a semiconductor circuit having two paths. The first path is a standard path, used for normal operation of the circuit. The second path is a test path, used for testing of the circuit. The second, test path adds delay as compared to the first, standard path. This delay acts as an internal guardband for the circuit.

40 Claims, 3 Drawing Sheets

INTERNAL GUARDBAND FOR SEMICONDUCTOR TESTING

This application is a Continuation of U.S. application Ser. No. 09/031,159, filed Feb. 26, 1998, now issued as U.S. Pat. No. 6,418,547.

FIELD OF THE INVENTION

This invention relates generally to the testing of semiconductors, and more particularly to an internal guardband for such semiconductor testing.

BACKGROUND OF THE INVENTION

Semiconductor technology pervades most electronic devices today. Computers, televisions, videocassette recorders, cameras, etc., all use semiconductor integrated circuits to varying degrees. For example, the typical computer includes microprocessors and dedicated controller integrated circuits (i.e., video controllers, audio controllers, etc.), as well as memory, such as dynamic random-access memory. The design and testing of semiconductors, therefore, is a crucial consideration of the design of almost any electronic device.

In one example of testing a semiconductor circuit, the circuit has a data strobe line that is asserted a predetermined amount of time after the beginning of a clock cycle. This is accomplished to test whether the circuit is operating correctly. For example, if the circuit is not operating correctly, asserting the data strobe line after a predetermined amount of time after the beginning of a clock cycle (defined as the access time) will produce the wrong effect or no effect at all. That is, the circuit will not output any data, or will not output the correct data.

The assertion of the data strobe line is usually performed by a testing device. Because of variance among different testing devices, the data strobe line is asserted a predetermined amount of time after the beginning of a clock cycle that is less than the amount of time governed by the specification for the semiconductor circuit. This difference between the amount of time actually waited by the testing device before asserting the data strobe line and the amount of time as governed by the circuit's specification is known as the guardband. (Those of ordinary skill within the art will appreciate that guardband is not definitionally limited to this difference, however, but rather that this difference is only one instance of guardband.) Providing a guardband during the testing of the circuit ensures that the circuit is operating correctly, allowing for variances among different testing devices, as well for allowable manufacturing tolerances within the circuit itself.

The prior art provides for guardband typically by the testing device itself. For example, if a circuit specification allows for fifteen nanosecond access time, the semiconductor circuit tester can provide for a four nanosecond guardband by testing the circuit at an eleven nanosecond access time. The difference between the specified access time and the guardband thus indicates to the tester the necessary access time to be dialed in to the testing device.

However, with the increased speed of semiconductor devices such as semiconductor memories, the resultant decreased clock cycles, access times, and hold times (the latter defined as the length of time that a line is asserted after waiting the appropriate access time) may render it difficult or impossible to provide a guardband by the testing device itself. For example, as those of ordinary skill within the art can appreciate, if a hold time is specified as one nanosecond, it is very difficult to provide for two nanoseconds of guardband in the testing of a semiconductor circuit.

This puts the semiconductor circuit tester in a compromising position. The tester, to allow for variances among different testing devices, should still provide a guardband when testing a semiconductor circuit. However, the prior art manner by which guardband is typically afforded, for example, by appropriately decreasing the access time as tested by a testing device, may not prove workable. Therefore, there is a need for providing a guardband in a manner that is not dependent on a testing device. That is, there is a need for ensuring guardband where guardband is not or cannot be provided by a testing device. Such a guardband should in particular be able to be provided even during the testing of very fast semiconductor devices.

SUMMARY OF THE INVENTION

The above-mentioned shortcomings, disadvantages and problems are addressed by the present invention, which will be understood by reading and studying the following specification. One aspect of the invention is a semiconductor circuit having two paths. The first path is a standard path, used for normal operation of the circuit. The second path is a test path, used for testing of the circuit. The second, test path adds delay as compared to the first, standard path.

During the testing of the semiconductor circuit, the test path is used by a testing device, instead of the standard path. The delay added by the test path acts as a guardband for the semiconductor circuit. Thus, for example, rather than decreasing the access time for the circuit as tested by the testing device, to have the testing device itself provide the guardband, the use of the test path by itself inherently provides the guardband. This means that the access time as governed by the specification for the circuit can be dialed in to the testing device, instead of the specified access time minus a desired guardband. The guardband is therefore internal to the semiconductor circuit itself, instead of being provided by an external testing device.

Providing for this internal guardband extends to the invention advantages not found in the prior art. Internal guardband is not dependent on a given testing device. Therefore, in instances where the testing device cannot provide a desired guardband, a guardband still exists because of the test path within the semiconductor circuit itself. This means that very fast semiconductor devices can be tested with a guardband, where testing devices would not otherwise be able to provide the guardband.

The present invention includes semiconductor circuits, semiconductor devices, guardband test circuits, and methods of varying scope. In addition to the aspects and advantages of the present invention described in this summary, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1:
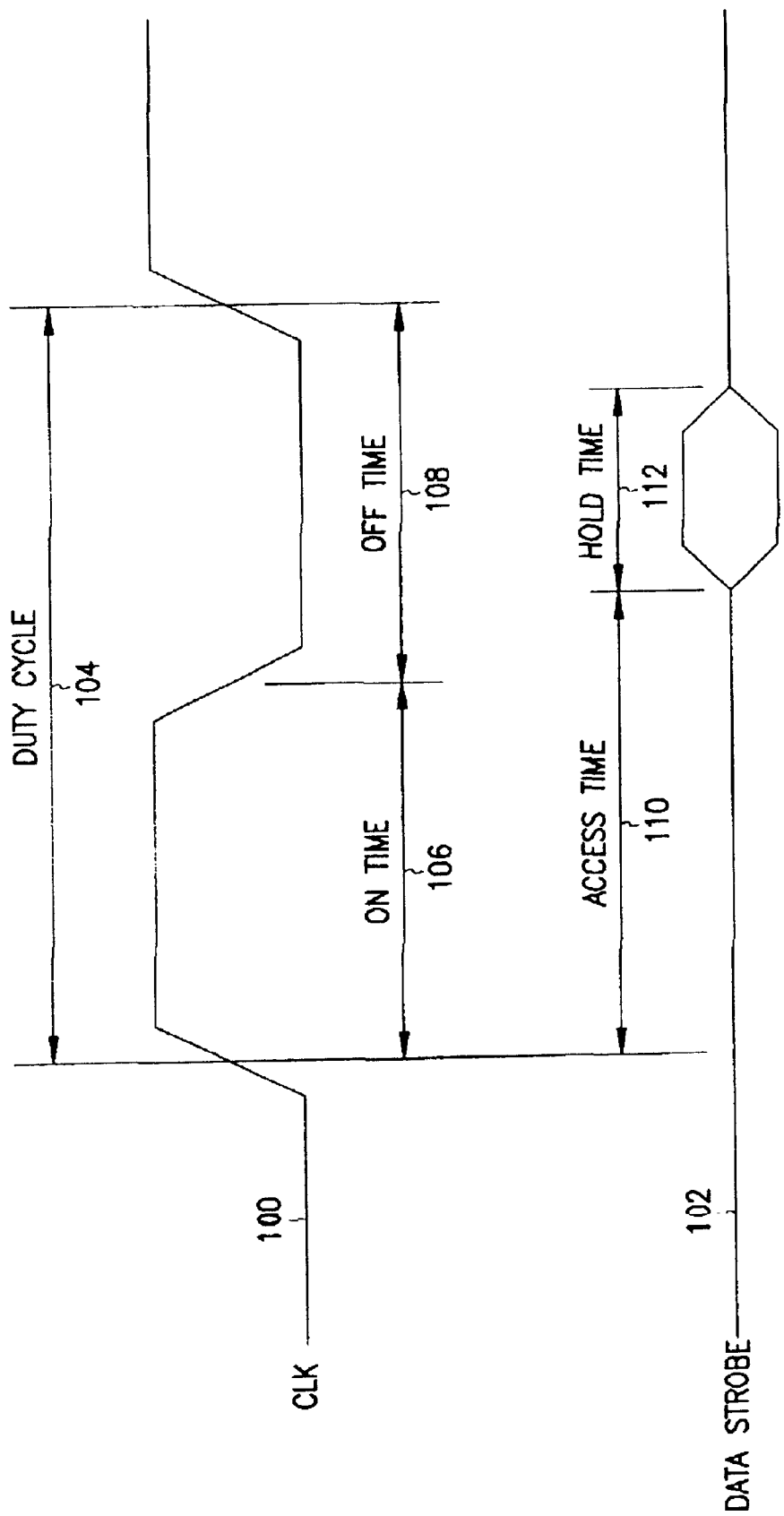
FIG. 1 is a timing diagram showing a typical assertion of a data strobe line within a clock cycle.

The present invention provides for an internal guardband for the testing of semiconductors. Referring first to FIG. 1, a timing diagram of two signals, clock signal 100, and data strobe line 102, is shown. Clock signal 100 as shown in FIG. 1 has one clock cycle, clock cycle 104. Clock cycle 104 is also referred to as the duty cycle of clock signal 100. Clock cycle 104 has two constituent parts, an on-time part 106, and an off-time part 108. On-time part 106 is the part of cycle 104 in which signal 100 is high (or asserted). Off-time part 108 is the part of cycle 104 in which signal 100 is low (or not asserted). In the context of testing semiconductor circuits using a testing device, clock signal I 00 is provided by the testing device.

Data strobe line 102 as shown in FIG. 1 is asserted an access time 110 after clock signal 100 first is asserted, and remains asserted for a hold time 112. In the context of testing semiconductor circuits using a testing device, data strobe line 102 is asserted by the testing device. Access time 110 in conjunction with an embodiment of the invention is the access time governed by the specification for the semiconductor circuit being tested. This compares with the prior art, for example, where access time 110 is the access time governed by the specification, minus a desired guardband. This is because in conjunction with embodiments of the invention, the desired guardband is provided internally within the semiconductor circuit being tested, as opposed to being provided by the testing device.

Those of ordinary skill within the art will appreciate that while guardband may be utilized in the context of access time in the assertion of a data strobe line, conceptually guardband is not limited to such application. Embodiments of the invention provide for the internal providing of a guardband within a semiconductor circuit or device, without reliance on an external device such as a testing device. The invention is not limited, however, to the application of guardband within the circuit or device; for example, besides access time, guardband may be use in hold times, as well as in other applications.

Figure 2:
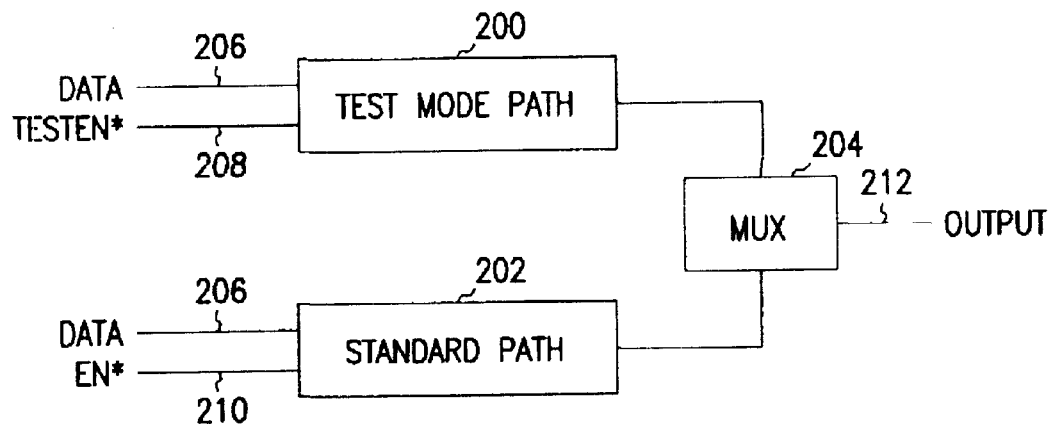
FIG. 2 is a block diagram showing a semiconductor circuit according to an exemplary embodiment of the invention.

Referring next to FIG. 2, a block diagram showing a semiconductor circuit according to an exemplary embodiment of the invention is shown. The circuit includes test mode path 200 and standard path 202 both coupled to multiplexer 204. Multiplexer 204 selects path 200 or path 202 depending on whether test enable line 208 is held low, or whether enable line 210 is held low, respectively. In either instance, data strobe line 206 may be asserted, and is ultimately output on output line 212.

Test mode path 200 is selected, by holding test enable line 208 low, when testing of the semiconductor circuit is desired. Selecting test mode path 200 adds a delay in the propagation of assertion of data strobe line 206 through path 200 and multiplexer 204 to output 212, as compared to the propagation of line 206 through standard path 202 and multiplexer 204 to output 212. This delay acts as a guardband when the circuit is being tested. When the circuit is being used in normal operation, test mode path 200 is not used; rather, standard path 200 is selected, by holding enable line 210 low.

Thus, a testing device coupled to the semiconductor circuit of FIG. 2 operates as follows. The testing device holds test enable line 208 low, and asserts data strobe line 206 as governed by the specifications for the circuit. The assertion of line 206 propagates through test mode path 200 in a delayed manner as compared to propagation through standard path 202, thus providing for a guardband. The assertion then propagates through multiplexer 204, and ultimately onto output line 212. Therefore, a guardband is provided internally within the semiconductor circuit, and no allowances for the guardband need to be made by the operator of the testing device.

Figure 3:
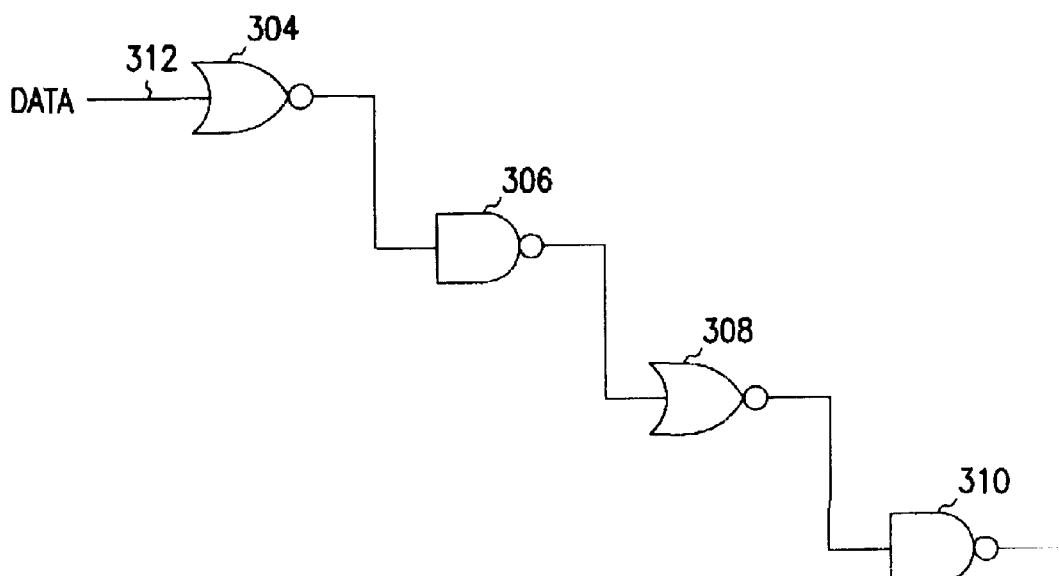
FIG. 3 is a schematic of a guardband test circuit according to an exemplary embodiment of the invention.

Referring next to FIG. 3, a schematic of a guardband test circuit according to an exemplary embodiment of the invention is shown. The test circuit of FIG. 3, for example, may be a part of test mode path 200 of FIG. 2. The test circuit of FIG. 3 includes delay components 304, 306, 308 and 310, for a total of four delay components, connected in series to one another, with data strobe line 312 acting as the input to the first delay component 304.

The invention is not limited to a given type of delay component. As shown in FIG. 3, each delay component is either a NOR gate or a NAND, adding about two-hundred picoseconds of delay (for each NOR gate), and about three-hundred to four-hundred picoseconds of delay (for each NAND gate, depending on the size of the NAND gate) to the signal asserted on line 312. Thus, components 304 and 308 are NOR gates, and components 306 and 310 are NAND gates. The invention is not limited, however, to any particular type of delay element or component; for example, a single delay element or component, which provides for a given desired amount of delay, may be used. Other delay elements and components include an inverter. Thus, the number of delay components within the circuit of FIG. 3 depends on the total delay, and hence guardband, desired. Dividing the desired guardband by the delay provided by a single delay component yields the number of components necessary for inclusion within the circuit (assuming that the components are identical to one another in the delay that they each provide).

Figure 4:
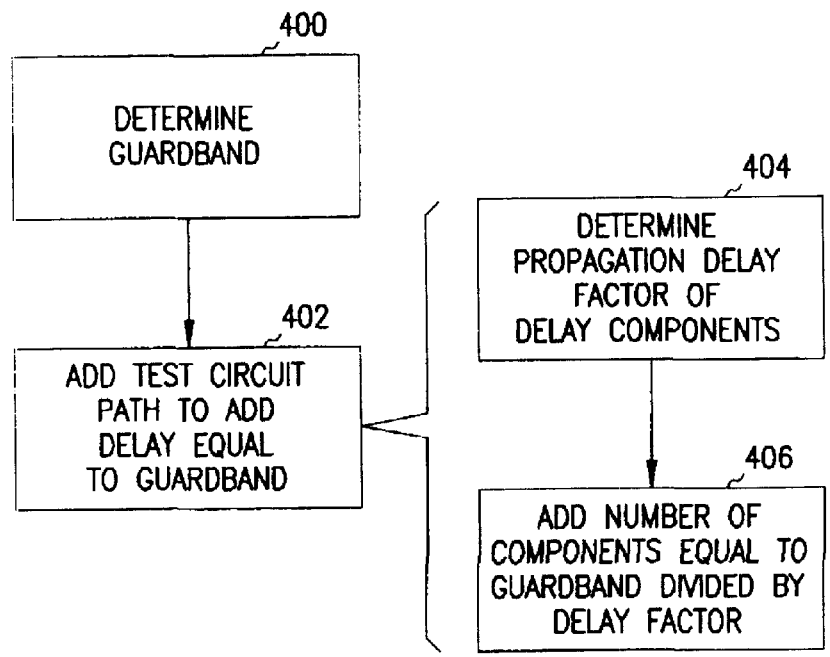
FIG. 4 is a flowchart of a method according to an exemplary embodiment of the invention; and, FIG. 5 is a diagram of a typical memory device in conjunction with which an embodiment of the invention may be implemented.

Referring next to FIG. 4, a flowchart of a method according to an exemplary embodiment of the invention is shown. In step 400, the desired guardband for a semiconductor circuit to be fabricated is determined. This guardband may be determined by specifications for the circuit, for example. In step 402, a test circuit path is added to the design of the circuit, that provides for delay equal to the desired guardband. Thus, during testing of the circuit, propagation of a signal through the test circuit path causes the guardband to be internally and inherently added, without reliance on an external device such as a testing device.

In one embodiment of the invention, step 402 is accomplished by performing steps 404 and 406. In step 404, the propagation delay factor of a single delay component is determined. Such components may include NAND gates or inverter gates, as has been described; however, the embodiment of the invention of steps 404 and 406 require that all the components be identical in the delay that they provide. In step 406, a number of components is added to the test circuit path, equal to the desired guardband divided by the propagation delay factor, to provide the guardband internally within the circuit.

Those of ordinary skill within the art can appreciate that the method of FIG. 4 is just one embodiment of the invention to determine the necessary delay components utilized in the invention. The invention itself, however, is not limited to the manner shown in FIG. 4 for designing a path having delay components. For example, only one component may be used, which by itself has the necessary and desired guardband delay. For further example, a path of varying components may be used, such as has been shown in FIG. 3 (i.e., a series of NOR and NAND gates).

Figure 5:
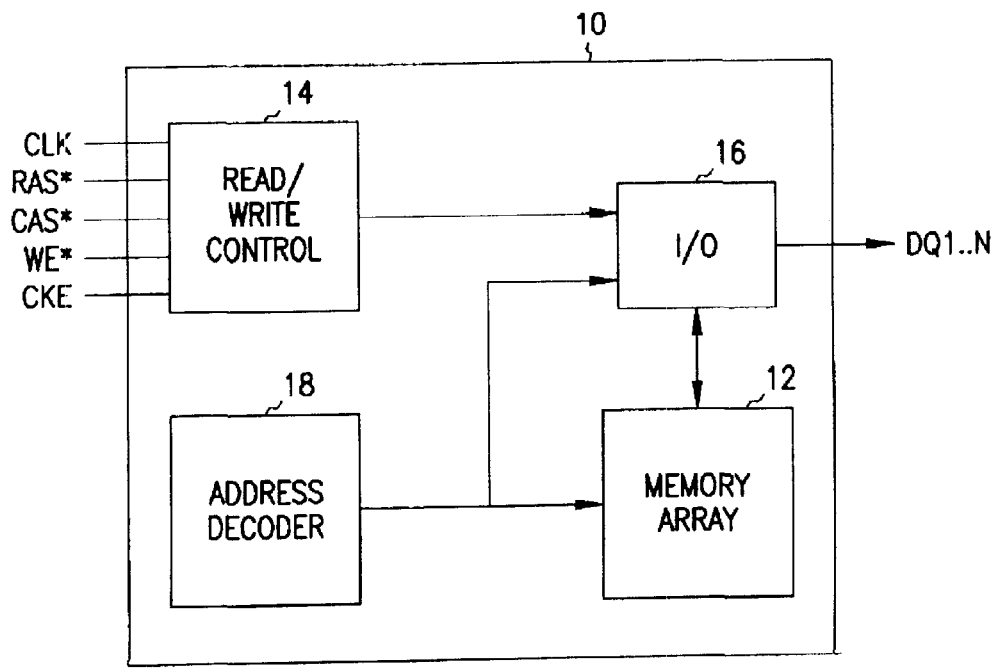

A typical memory device in conjunction with which an embodiment of the invention may be implemented is shown in FIG. 5. Memory device 10 includes memory array 12, control circuit 14, input/output buffers 16, and address decoder 18. Memory array 12 includes a plurality of memory cells organized into rows and columns. The memory cells are accessed in response to an address signal provided on the address lines A0 ... AN running to address decoder 18, which includes both row and column decoder circuitry. Input/output buffers 16 are provided for bi-directional communication via the data communications lines DQ1 ... DQN running out of buffers 16. Control circuit 14 regulates the memory device operations in response to controls signals including, but not limited to, a Clock (CLK), a Row Access Strobe (RAS*), a Column Access Strobe (CAS*), a Write Enable (WE*), and a Clock Enable (CKE).

As will be appreciated by those skilled in the art, the present invention is not limited to any particular type of memory device or repair memory device. In one embodiment, the devices are dynamic random-access-memories (DRAMs), including those available from Micron Technology, Inc., of Boise, Id. In other embodiments, the devices are static random-access-memories (SRAMs), flash memories, synchronous dynamic random-access-memories (SDRAMs), extended-data-out random-access-memories (EDO RAMs), and burst-extended-data-out random-access-memories (BEDO RAMs), as those skilled in the art will appreciate.

An internal guardband for the testing of semiconductors has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, guardband has been described in conjunction with access time; however, this is only one instance of guardband. Other instances of guardband may occur within hold time, for example, as well as other times. Therefore, it is manifestly intended that this invention be limited only by the following claims and equivalents thereof.

I claim:

1. A memory device comprising a memory circuit; and a test mode circuit having an internal guardband for testing purposes, wherein the internal guardband is provided within the memory circuit and not by an external testing device.

2. The memory device of claim 1, wherein the test mode circuit comprises a test path that adds a delay as compared to a standard path.

3. The memory device of claim 1, wherein the memory device is selected from a group consisting of: dynamic random-access memory (DRAM), static random-access memory (SRAM), flash memory, synchronous dynamic random-access memory (SDRAM), extended-data-out random-access memory (EDO RAM), and burst-extended-data-out random-access-memory (BEDO RAM).

4. A guardband test circuit within a memory device having a test mode and a standard mode, comprising:

a plurality of serially connected delay components;

an internal guardband produced by the plurality of serially connected delay components in the test mode.

5. The guardband test circuit of claim 4, wherein each delay component comprises a gate.

6. The guardband test circuit of claim 4, wherein each delay component comprises an inverter.

7. A method to add an internal guardband to a memory circuit, comprising:

determining a desired guardband value for the internal guardband of the memory circuit; and, adding a test circuit path to the memory circuit having a propagation delay equal to the desired guardband value.

8. The method of claim 7, wherein adding a test circuit path comprises:

determining a propagation delay factor of a desired delay component; and, serially coupling a number of the desired delay components to achieve the propagation delay equal to the desired guardband value, wherein the number of the desired delay components is equal to the propagation delay divided by the propagation delay factor.

9. A memory circuit comprising:

an internal guardband;

means for accessing the circuit in standard operation; and, means for accessing the circuit in a test mode, wherein the means for accessing the circuit in test mode adds delay as compared to the means for accessing the circuit in standard operation, wherein the delay is equal to the internal guardband.

10. The memory circuit of claim 9, wherein the means for accessing the circuit in the test mode comprises a series of delay components to add the delay as compared to the means for accessing the circuit in standard operation.

11. A memory device, comprising:

a standard control signal path that passes a control signal therethrough; and a test mode circuit having an internal guardband for testing purposes, wherein the test mode circuit includes a test path that adds a delay as compared to the same control signal passing through the standard control signal path to produce the internal guardband.

12. The memory device of claim 11, wherein the memory device is a dynamic random access memory (DRAM).

13. The memory device of claim 11, wherein the memory device is a static random access memory (SRAM).

14. The memory device of claim 11, wherein the memory device is an extended-data-out random access memory (EDO RAM).

15. The memory device of claim 11, wherein the memory device is a burst-extended-data-out random access memory (BEDO RAM).

16. A method comprising:
providing a control signal to a memory device;
performing a memory circuit function during a normal operation of the memory device in response to the control signal;
delaying the control signal in the memory device to generate a test signal for testing a memory circuit in order to stress the memory device;
testing memory circuit function in response to the delayed control signal, and
wherein providing a control signal includes providing a control signal to a dynamic random access memory (DRAM).

17. The method of claim 16, wherein delaying the control signal includes delaying the control signal by a predetermined internal guardband value.

18. The method of claim 16, wherein delaying the control signal includes asserting a signal through a series of delay components.

19. The method of claim 18, wherein asserting the signal includes asserting a data strobe signal at a first delay component in the series of delay components.

20. The method of claim 16, wherein asserting the signal includes asserting a data strobe signal at a first delay component in the series of delay components.

21. A method comprising:
providing a control signal to a memory device;
performing a memory circuit function during a normal operation of the memory device in response to the control signal;
delaying the control signal in the memory device to generate a test signal for testing a memory circuit in order to stress the memory device;
testing memory circuit function in response to the delayed control signal, and
wherein providing a control signal includes providing a control signal to a static random access memory (SRAM).

22. The method of claim 21, wherein delaying the control signal includes delaying the control signal by a predetermined internal guardband value.

23. The method of claim 21, wherein delaying the control signal includes asserting a signal through a series of delay components.

24. A method comprising:
providing a control signal to a memory device;
performing a memory circuit function during a normal operation of the memory device in response to the control signal;
delaying the control signal in the memory device to generate a test signal for testing a memory circuit in order to stress the memory device;
testing memory circuit function in response to the delayed control signal, and
wherein providing a control signal includes providing a control signal to an extended-data-out random access memory (EDO RAM).

25. The method of claim 24, wherein delaying the control signal includes delaying the control signal by a predetermined internal guardband value.

26. The method of claim 24, wherein delaying the control signal includes asserting a signal through a series of delay components.

27. The method of claim 26, wherein asserting the signal includes asserting a data strobe signal at a first delay component in the series of delay components.

28. A method comprising:
providing a control signal to a memory device;
performing a memory circuit function during a normal operation of the memory device in response to the control signal;
delaying the control signal in the memory device to generate a test signal for testing a memory circuit in order to stress the memory device;
testing memory circuit function in response to the delayed control signal, and
wherein providing a control signal includes providing a control signal to a burst-extended-data-out random access memory (BEDO RAM).

29. The method of claim 28, wherein delaying the control signal includes delaying the control signal by a predetermined internal guardband value.

30. The method of claim 28, wherein delaying the control signal includes asserting a signal through a series of delay components.

31. The method of claim 30, wherein asserting the signal includes asserting a data strobe signal at a first delay component in the series of delay components.

32. A method comprising:
generating a data strobe signal in a memory device;
internally generating a test enable signal in the memory device;
delaying the data strobe signal by a predetermined guardband amount in response to the test enable signal to stress the memory device; and
wherein internally generating a test enable signal includes internally generating a test enable signal in a dynamic random access memory (DRAM).

33. A method comprising:
generating a data strobe signal in a memory device;
internally generating a test enable signal in the memory device;
delaying the data strobe signal by a predetermined guardband amount in response to the test enable signal to stress the memory device; and
wherein internally generating a test enable signal includes internally generating a test enable signal in a static random access memory (SRAM).

34. A method comprising:
generating a data strobe signal in a memory device;
internally generating a test enable signal in the memory device;
delaying the data strobe signal by a predetermined guardband amount in response to the test enable signal to stress the memory device; and
wherein internally generating a test enable signal includes internally generating a test enable signal in an extended-data-out random access memory (EDO RAM).

35. A method comprising:
generating a data strobe signal in a memory device;
internally generating a test enable signal in the memory device;
delaying the data strobe signal by a predetermined guardband amount in response to the test enable signal to stress the memory device; and
wherein internally generating a test enable signal includes internally generating a test enable signal in a burst-extended-data-out random access memory (BEDO RAM).

36. A method, comprising:

generating a data strobe signal in a memory device;

internally generating a test enable signal in the memory device;

delaying the data strobe signal by a predetermined guard-band amount in response to the test enable signal to stress the memory device; and performing a circuit test during an interval when the delayed data strobe signal is being delayed.

37. The method of claim 36, wherein internally generating a test enable signal includes internally generating a test enable signal in a dynamic random access memory (DRAM).

38. The method of claim 36, wherein internally generating a test enable signal includes internally generating a test enable signal in a static random access memory (SRAM).

39. The method of claim 36, wherein internally generating a test enable signal includes internally generating a test enable signal in an extended-data-out random access memory (EDO RAM).

40. The method of claim 36, wherein internally generating a test enable signal includes internally generating a test enable signal in a burst-extended-data-out random access memory (BEDO RAM).

* * * * *